United States Patent
Ishibashi et al.

(10) Patent No.: US 7,722,998 B2
(45) Date of Patent: May 25, 2010

(54) REFLECTIVE MASK BLANK

(75) Inventors: Shinichi Ishibashi, Tokyo (JP); Yoichi Usui, Tokyo (JP)

(73) Assignee: Hoya Corporation, Tokyo (JP)

(*) Notice: Subject to any disclaimer, the term of this patent is extended or adjusted under 35 U.S.C. 154(b) by 75 days.

(21) Appl. No.: 12/016,297

(22) Filed: Jan. 18, 2008

(65) Prior Publication Data

US 2008/0193862 A1 Aug. 14, 2008

Related U.S. Application Data

(62) Division of application No. 10/519,991, filed on Jan. 4, 2005, now Pat. No. 7,348,105.

(51) Int. Cl.
*G03F 1/00* (2006.01)

(52) U.S. Cl. ......................................................... 430/5

(58) Field of Classification Search .................. 430/5, 430/322, 394; 428/428, 430; 378/35
See application file for complete search history.

(56) References Cited

U.S. PATENT DOCUMENTS

| | | | |
|---|---|---|---|
| 6,178,221 B1 | 1/2001 | Levinson et al. | |
| 6,410,193 B1 | 6/2002 | Stivers et al. | |
| 6,596,465 B1 * | 7/2003 | Mangat et al. | 430/311 |
| 6,607,862 B2 | 8/2003 | Yan et al. | |
| 6,610,447 B2 * | 8/2003 | Yan et al. | 430/5 |
| 7,026,076 B2 * | 4/2006 | Wasson et al. | 430/5 |
| 7,118,832 B2 | 10/2006 | Yan | |
| 2002/0045108 A1 | 4/2002 | Lee et al. | |

FOREIGN PATENT DOCUMENTS

| | | | |
|---|---|---|---|
| JP | 59-89422 | A | 5/1984 |
| JP | 2-174214 | A | 7/1990 |
| JP | 06-188177 | A | 7/1994 |
| JP | 7-333829 | A | 12/1995 |
| JP | 8-213303 | A | 8/1996 |
| JP | 2001-174976 | A | 6/2001 |
| JP | 2001-237174 | A | 8/2001 |
| JP | 2002-122981 | A | 4/2002 |
| JP | 2004-6798 | A | 1/2004 |
| WO | WO 02/41077 | A2 | 5/2002 |

OTHER PUBLICATIONS

Ted Liang, et al. "Enhanced Optical Inspectability of Patterned EUVL Mask", Intel Corporation Components Research, Proceedings of SPIE Vo. 4562 (2002), pp. 288-296.
Semiconditor Equipment and Materials International SEMI Draft Document 3414 "Specification for Absorbing Film Stacks and Multilayers on Extreme Ultraviolet Lithography Mask Blanks" Document No. 3414 dated Apr. 29, 2002.

* cited by examiner

*Primary Examiner*—Stephen Rosasco
(74) *Attorney, Agent, or Firm*—Sughrue Mion, PLLC (57) ABSTRACT

A reflective mask and a reflective mask blank that can form a fine mask pattern with high accuracy in shape, achieve a sufficient contrast in a pattern inspection, and enable a pattern transfer with high accuracy. On a substrate (11), a multilayer reflective film (12) for reflecting an exposure light, a buffer layer (13), and an absorber layer for absorbing the exposure light are successively deposited in this order. This absorber layer has a layered structure composed of an uppermost layer (15) and a lower layer (14) other than it. The uppermost layer (15) exhibits a reflectance of 20% or less with respect to a light having an inspection wavelength for use in an inspection of a pattern formed in the absorber layer and further is formed of an inorganic material having a resistance against an etching condition in forming a pattern in the lower layer.

12 Claims, 4 Drawing Sheets

FIG. 4

REFLECTIVE MASK BLANK

This is a divisional of application Ser. No. 10/519,991 filed Jan. 4, 2005 now U.S. Pat. No. 7,348,105. The entire disclosure(s) of the prior application(s), application Ser. No. 10/519,991 is hereby incorporated by reference.

TECHNICAL FIELD

The present invention relates to a reflective mask for use in semiconductor production or the like, and a reflective mask blank for producing the same.

BACKGROUND ART

In recent years, following high integration of semiconductor products as seen in semiconductor memories, VLSIs (very large scale integrated circuits), and so forth, there have been required fine patterns that exceed a transfer limit of the photolithography process. In view of this, in order to enable transfer of the fine pattern, there has been proposed an extreme ultraviolet lithography process (EUV lithography process) using an extreme ultraviolet light with a shorter wavelength. Herein, the EUV light represents a light in a wavelength band of a soft X-ray region or a vacuum ultraviolet region, specifically, a light with a wavelength of about 0.2 to 100 nm.

As described in, for example, Japanese Patent Application Publication (JP-A) No. H8-213303, an EUV reflective mask for use in the EUV lithography has, on a substrate of silicon, quartz, or the like, an EUV (extreme ultraviolet light in the soft X-ray region having, for example, a wavelength of about 13.4 nm) multilayer reflective layer, a buffer layer thereon, and further thereon, an EUV absorber layer formed in a pattern. The buffer layer is provided between the EUV multilayer reflective layer and the EUV absorber layer for the purpose of protecting the EUV multilayer reflective layer during a pattern forming process of the absorber layer and a repairing process thereof.

Light incident on the reflective mask in an exposure apparatus is absorbed at a portion where the absorber pattern exists, while an image reflected by the multilayer reflective film where no absorber pattern exists is transferred onto a wafer through a reflective optical system.

Figure 4:
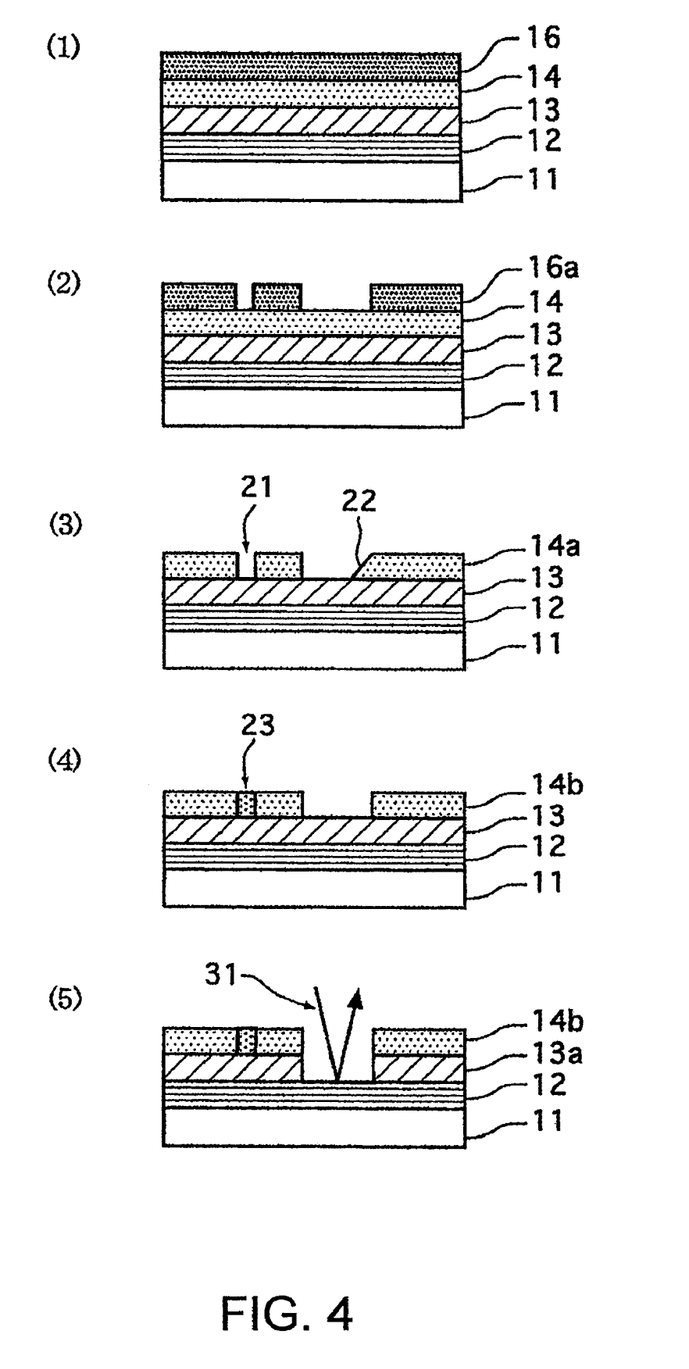
FIG. 4 is a sectional structural view showing a manufacturing process of a conventional reflective mask.

Referring to FIG. 4, description will be given about a manufacturing method of a reflective mask for use in the EUV lithography. FIG. 4 is a schematic sectional view showing a conventional reflective mask manufacturing process.

(1) On a $SiO_2$ substrate 11 are formed, in order, a layered film 12 being an EUV multilayer reflective film, a buffer layer 13 thereon for the purpose of protecting the EUV layer in an absorber pattern forming process, and an absorber layer 14 being an EUV absorber thereon. Thereafter, an organic resist film 16 is applied to the surface of the absorber layer (FIG. 4(1)).

(2) The organic resist film 16 is formed with a resist pattern 16a (FIG. 4(2)).

(3) The absorber layer 14 is etched by the use of the resist pattern 16a to thereby form an absorber pattern 14a having a predetermined pattern. Here, the formed absorber pattern 14a is subjected to inspection (FIG. 4(3)). Specifically, detection is made of a pinhole defect 21 (also called a white defect) formed by removal of the absorber layer at a portion that should not be removed by etching and a portion 22 (also called a black defect) where the absorber layer is not sufficiently removed due to insufficient etching.

(4) The defects of the absorber pattern 14a are corrected to thereby form a corrected absorber pattern 14b (FIG. 4(4)).

(5) Finally, a pattern 13a of the buffer layer 13 is formed to thereby obtain an EUV reflective mask. When an EUV light 31 is irradiated thereto, the EUV light 31 is reflected only at a portion where the reflective layered film 12 is exposed by removing the absorber layer 14 and the buffer layer 13, and can be used for the lithography (FIG. 4(5)).

In the foregoing EUV reflective mask producing process, use is made of a reflective inspection device using a far ultraviolet light having a wavelength of 193 nm to 257 nm in the inspection of the absorber pattern at (3).

The inspection is performed by applying this inspection light to the surface of the reflective mask formed with the pattern and by observing a contrast of reflection of the inspection light on the surface of the mask.

Further, after the removal of the buffer layer at (5), an inspection is carried out to finally confirm whether or not the absorber pattern is formed according to a specification. This final inspection of the pattern is also conducted by, like the foregoing inspection, using the far ultraviolet light as the inspection light and observing a contrast of reflected light of the inspection light on the surface of the mask.

In the foregoing formation of the transfer pattern in the absorber layer, use is made of the resist made of an organic substance. However, such a resist generally has a low resistance against dry etching so that the resist film is damaged during the formation of the pattern of the absorber layer. Therefore, the resist layer is required to have a certain or greater thickness (normally about 500 nm to 800 nm).

On the other hand, as the line width of a pattern required for a mask is reduced, it becomes difficult to form a fine pattern in such a thick resist in view of the following points.

Specifically, first, it is difficult to ensure the accuracy in shape in a vertical direction of the resist so that the shape accuracy of an absorber pattern is degraded. Secondly, an etching gas is reluctant to advance into narrow paths of the resist pattern and a gas generated by etching is also liable to stay therein so that the etching reaction is difficult to proceed at portions where the line width is narrow. Consequently, a difference is caused between etching speeds at a portion where the line width is broad and at a portion where the line width is narrow so that uniform etching cannot be achieved in the plane of the mask.

From this point of view, there has been a problem that when the conventional thick resist is used, it is difficult to form a pattern with a fine line width, for example, a resolution of 0.1 µm or less.

On the other hand, in the foregoing inspection of the pattern of the absorber layer, the inspection using the foregoing inspection light is performed between the surface of the buffer layer exposed at a portion where the absorber layer is removed or the surface of the multilayer reflective film exposed by the removal of the buffer layer, and the surface of the absorber layer at a portion where the absorber layer remains.

Therefore, there has been a problem that if a difference in reflectance with respect to the wavelength of the inspection light is small between the surface of the buffer layer or the surface of the multilayer reflective film and the surface of the absorber layer, the contrast in the inspection becomes poor so that the accurate inspection cannot be achieved.

In view of this, the present invention has been made for solving the foregoing problems and has an object to obtain a reflective mask and a reflective mask blank wherein a fine pattern can be formed in an absorber layer with high accuracy in shape, a sufficient contrast can be achieved in a pattern inspection, and a pattern transfer with high accuracy is enabled.

DISCLOSURE OF THE INVENTION

With respect to the foregoing problem about the contrast in the pattern inspection, the present applicant has previously proposed a reflective mask and a reflective mask blank having a structure wherein an absorber layer has a layered structure and an uppermost layer thereof is a low reflective layer made of a material having a low reflectance with respect to a light that is used in a pattern inspection (Japanese Patent Application No. 2002-108808).

The present inventors have improved this reflective mask and found that, by the use of a material having a predetermined property for the foregoing low reflective layer, the low reflective layer can also have a function of an inorganic etching mask layer when forming a pattern in a lower layer of the absorber layer. Further, they have found that the foregoing problems can be solved by causing the low reflective layer to function as a thin inorganic etching mask layer.

Specifically, a reflective mask blank of the present invention is a reflective mask blank comprising a substrate, and a multilayer reflective film for reflecting an exposure light and an absorber layer for absorbing the exposure light, which are formed on the substrate in the order named, and is characterized in that the absorber layer has a layered structure comprising at least an uppermost layer and a lower layer other than it, and the uppermost layer exhibits a reflectance of 20% or less with respect to a light having an inspection wavelength for use in an inspection of an absorber layer pattern formed in the absorber layer and further is formed of an inorganic material having a resistance against an etching condition in forming a pattern in the lower layer.

On the other hand, a reflective mask blank of the present invention is a reflective mask blank comprising a substrate, and a multilayer reflective film for reflecting an exposure light and an absorber layer for absorbing the exposure light, which are formed on the substrate in the order named, and is characterized in that the absorber layer has a layered structure comprising at least an uppermost layer and a lower layer other than it, and the uppermost layer exhibits a contrast value of 40% or more relative to a layer just under the absorber layer with respect to a light having an inspection wavelength for use in an inspection of an absorber layer pattern formed in the absorber layer and further is formed of an inorganic material having a resistance against an etching condition in forming a pattern in the lower layer, the contrast value given by an equation of Contrast Value(%)=$(R_2-R_1)/(R_2+R_1) \times 100$ (where $R_1$ represents a reflectance on the surface of the uppermost layer with respect to the light having the inspection wavelength and $R_2$ represents a reflectance on the surface of the layer just under the absorber layer).

In the inspection of the absorber layer pattern, use is made of the inspection light having a wavelength that falls within a range of 190 nm to 260 nm.

Preferably, the etching selection ratio between the uppermost layer and the lower layer of the absorber layer when forming the pattern in the lower layer is 5 or more.

As specific materials of the absorber layer, for example, the lower layer of the absorber layer can be made of a material containing tantalum (Ta) and the uppermost layer can be made of a material containing silicon (Si).

A buffer layer having a resistance against an etching condition in forming the pattern in the lower layer of the absorber layer and correcting the pattern may be further provided between the multilayer reflective film and the absorber layer. This buffer layer can be made of a material containing, for example, chromium (Cr).

A reflective mask of the present invention is produced by forming the pattern in the absorber layer of the foregoing reflective mask blank.

A reflective mask of the present invention can be manufactured by first forming a pattern in an uppermost layer of an absorber layer having a layered structure, then etching a lower layer of the absorber layer by the use of the pattern formed in the uppermost layer as a mask to thereby form a pattern in the lower layer.

When a buffer layer is further provided between the multilayer reflective film and the absorber layer, the buffer layer is etched, after forming the patterns in the uppermost layer and the lower layer of the absorber layer, by the use of a pattern formed in the absorber layer as a mask to thereby form a pattern in the buffer layer.

BEST MODE FOR CARRYING OUT THE INVENTION

Description will be made hereinbelow about an embodiment of a reflective mask blank and a reflective mask according to the present invention. The reflective mask blank and the reflective mask of the present invention each have a structure in which respective layers, i.e. a multilayer reflective film and an absorber layer, are formed on a substrate in the order named, and the absorber layer has a layered structure. A buffer layer having a resistance against the etching condition in pattern formation and pattern correction of the absorber layer may be provided between the multilayer reflective layer and the absorber layer.

Here, description will be given about the respective layers forming the reflective mask blank or the reflective mask of the present invention.

The absorber layer will first be described.

The absorber layer of the reflective mask blank or the reflective mask of the present invention has a function of absorbing an EUV light serving as an exposure light. The absorber layer of the present invention has a layered structure composed of an uppermost layer and a lower layer other than it. The lower layer may be composed of a plurality of layers. However, the absorber layer preferably has a two-layer structure comprising the uppermost layer and the lower layer in the form of a single layer because kinds of manufacturing processes and materials become less.

Next, the uppermost layer will be described.

The uppermost layer of the present invention functions as a low reflective layer in an inspection of an absorber pattern formed in the absorber layer and further functions as an etching mask when forming the pattern in the absorber lower layer.

First, selection is made of a material for the uppermost layer of the present invention, which can achieve a sufficient contrast with respect to the layer (normally the later-described buffer layer or multilayer reflective film) formed just under the absorber layer in the inspection of the absorber pattern. The contrast value with respect to the layer located just under the absorber layer in the inspection is set to 40% or more, preferably 60% or more.

The contrast value in the inspection is defined as the following equation.

Contrast Value(%)=$(R_2 R_1)/(R_2+R_1) \times 100$ (where $R_1$ and $R_2$ represent reflectances on the respective layers to be inspected and $R_2 > R_1$)

For example, when a light with a wavelength of 257 nm is used as an inspection light, the reflectance of a substance generally used for a buffer layer is about 40% in case of $SiO_2$ and about 50% in case of Cr. On the other hand, the reflectance of a multilayer reflective film in the form of a Mo/Si periodic multilayer film generally used with respect to an exposure light having a wavelength around 13 nm is about 60% with respect to the far ultraviolet light. Since, as described above, the reflectances of the generally used buffer layer and multilayer reflective film with respect to the inspection wavelength are relatively large, it is advantageous to use a material having a small reflectance with respect to the inspection wavelength as a material of the uppermost layer in order to achieve the foregoing sufficient contrast.

From this point of view, the reflectance of the uppermost layer of the absorber layer with respect to the inspection wavelength is preferably set to 20% or less, and more preferably 10% or less.

Further, among materials satisfying the foregoing condition of the reflectance with respect to the inspection light, selection is made of an inorganic material for the uppermost layer of the present invention, which has a resistance against the etching condition in forming the pattern in the lower layer of the absorber layer.

The etching mask using the inorganic material is excellent in dry etching resistance as compared with the conventional resist using the organic substance and therefore can be formed thin. Accordingly, it is possible to form a pattern in the absorber layer with high shape accuracy even in case of the pattern having a fine line width.

The etching selection ratio between the uppermost layer and the lower layer is preferably 5 or more, and more preferably 10 or more. As the etching selection ratio increases, the uppermost layer can be thinner. However, if the uppermost layer is too thin, the reflection with respect to the inspection wavelength increases. Therefore, in order to ensure the foregoing reflectance with respect to the inspection wavelength, the uppermost layer is normally formed to a thickness of about 15 to 30 nm.

Since, as described above, the uppermost layer of the absorber layer of the present invention has the low reflectance with respect to the inspection wavelength and further has the function of the etching mask layer when forming the pattern in the lower layer, it is possible to obtain the reflective mask and the reflective mask blank that can, with the simple layer structure, sufficiently achieve the contrast in the inspection and accurately form the absorber pattern having the fine line width. Further, when the buffer layer is provided between the multilayer reflective film and the absorber layer, the uppermost layer can also be used as a mask when forming the pattern in the buffer layer.

Next, the lower layer of the absorber layer will be described. The lower layer mainly functions to absorb the EUV light serving as the exposure light. Therefore, use is made of a substance that can largely absorb the EUV light. As such a lower layer of the absorber layer, a material containing tantalum, for example, tantalum or a tantalum alloy, is preferably used because it has a large absorption coefficient with respect to the EUV light and is excellent in workability.

As specific examples of such a material, there can be cited a simple substance of tantalum, a tantalum-boron alloy (TaB), a tantalum-boron alloy nitride (TaBN), a tantalum-germanium alloy (TaGe), a tantalum-germanium alloy nitride (TaGeN), a tantalum-silicon alloy (TaSi), a tantalum-silicon alloy nitride (TaSiN), a tantalum-silicon-boron alloy (TaSiB), a tantalum-germanium-boron alloy (TaGeB), a tantalum-silicon-boron alloy nitride (TaSiBN), a tantalum-germanium-boron alloy nitride (TaGeBN), and so forth. Further, carbon or oxygen may also be contained therein.

Preferably, the film structure of the lower layer of the present invention is in the form of microcrystals (grain size: several nm or less) or in an amorphous state in terms of stability against deterioration with age and resistance to environment. The alloy containing tantalum and boron has an advantage that it is easily transformed into an amorphous state so that a film excellent in smoothness can be obtained. Further, because of being also excellent in controllability of a film stress, it is preferable in that a mask pattern can be formed with high dimensional accuracy. In this case, the content of boron preferable for transformation into the amorphous state is 10 to 25 at %. The substance containing nitrogen in the alloy of tantalum and boron is also preferably used. By adding nitrogen, it is possible to obtain an effect of improving smoothness of a film to reduce a surface roughness.

Other than the material containing tantalum, use may be made of a material containing chromium, manganese, gallium, hafnium, or tungsten, for example, a simple substance thereof or an alloy containing such an element, for the lower layer of the absorber layer of the present invention.

In the reflective mask, the exposure light is incident in a direction inclined by several degrees from a direction perpendicular to the mask plane. Therefore, when the thickness of the absorber pattern is thick, the shadow of the pattern itself is caused so that a clear transfer image cannot be obtained due to occurrence of fuzz or the like at an edge portion of the pattern at the time of the exposure. Thus, the thickness of the whole absorber layer is preferably thin. From this point of view, it is advantageous for the lower layer of the absorber layer to have a greater absorption coefficient with respect to the wavelength of the exposure light, and the absorption coefficient is preferably 0.025 or more, and more preferably 0.030 or more. The film thickness of the whole absorber layer is set to a value that can sufficiently absorb the EUV light serving as the exposure light and is desirably as small as possible, and is normally set to about 30 to 100 nm and more preferably 80 nm or less.

For the purpose of reducing the thickness of the whole absorber layer, it is advantageous that the uppermost layer has a higher EUV absorption rate. This is because, as the EUV absorbing power of the uppermost layer increases, the lower layer can be thinner correspondingly. The EUV absorption coefficient of the material of the uppermost layer is preferably 0.01 or more, and more preferably 0.015 or more.

As described above, in the present invention, by forming the absorber layer into the layered structure to give the separate functions to the uppermost layer and the lower layer, the properties of the respective layers can be optimized and, as a result, there is also the advantage that the thickness of the absorber layer can be reduced.

The absorber layer (the uppermost layer and the lower layer) can be manufactured by the general film forming method such as the sputtering method like magnetron sputtering or the like. For example, in case of a tantalum-boron alloy nitride (TaBN), the film formation can be performed by the reactive DC sputtering method using an alloy target containing tantalum and boron and using an argon gas with nitrogen added.

Next, the buffer layer will be described.

The buffer layer has a function of protecting the multilayer reflective film when forming the pattern in the absorber layer and correcting the pattern. For this reason, selection is made, for the buffer layer of the present invention, of a material having a resistance against the etching condition in the pattern formation of the lower layer of the absorber layer.

For example, as a buffer layer that is combined with the material containing Ta of the lower layer of the absorber layer, use is preferably made of a buffer layer made of a material containing Cr. The buffer layer made of the material containing Cr can take a large etching selection ratio (20 or more) with respect to the absorber layer containing Ta of the present invention. Further, the material containing Cr exhibits a reflectance of about 40% to 55% with respect to the inspection wavelength and is therefore preferable also in terms of a relationship of reflectances on the surface of the later-described multilayer reflective film, the surface of the buffer layer, and the surface of the absorber layer with respect to the inspection wavelength. Furthermore, when removing the buffer layer, it can be removed while causing almost no damage to the multilayer reflective film.

As the material containing Cr which is used for the buffer layer, use may be preferably made of, other than a simple substance of Cr, a material containing Cr and at least one element selected from N, O, and C, for example, a chromium nitride (CrN), a chromium oxide (CrO), a chromium carbide (CrC), a chromium oxynitride (CrNO), a chromium carbooxynitride (CrCNO) or the like.

The buffer layer containing Cr can be formed by the sputtering method such as the magnetron sputtering method. For example, in case of the foregoing chromium nitride film, the film formation may be carried out using a Cr target in an atmosphere of a gas containing Ar and about 5 to 40% of nitrogen added thereto.

The film thickness of the buffer layer is preferably set to 30 to 50 nm when the correction of the absorber pattern is performed using a focused ion beam (FIB), while it can be thin, i.e. 4 to 10 nm, when the FIB is not used.

As a material of a buffer layer that can be used in combination with the absorber layer of the present invention, there may be cited, other than the above, $SiO_2$, a silicon oxynitride (SiON), Ru, or the like. In combination with the absorber layer not containing Ta, Ta may be used as a buffer layer.

In the present invention, in order to realize the function of the uppermost layer of the absorber layer as the etching mask when forming the pattern in the lower pattern, the combination of the materials of the uppermost layer and the lower layer is important. Further, when the buffer layer is provided, the combination of the materials between the buffer layer and the respective layers is also important.

Hereinbelow, description will be given about selection of materials of the respective layers.

First, when the buffer layer is not provided, the minimum conditions required for the uppermost layer are that it exhibits a low reflectance with respect to the inspection light for the absorber pattern, that it has a resistance against the etching condition of the lower layer of the absorber layer, and that the lower layer is not etched under the etching condition in the formation of the mask pattern in the uppermost layer (the lower layer has a resistance against the etching condition of the uppermost layer). Accordingly, first, the uppermost layer and the lower layer of the absorber layer preferably have totally different etching properties. When a material containing, for example, Ta is used for the lower layer of the absorber layer, pattern formation is normally carried out by dry etching using a chlorine gas. Therefore, the material of the uppermost layer is selected from materials each having a resistance against the chlorine etching and further each being etchable under the etching condition against which the material containing Ta has a resistance. As such materials, there may be cited, for example, materials containing Si and materials containing Cr. Among those materials, selection is made of a material that exhibits a sufficiently low reflectance with respect to the light having the inspection wavelength for use in the inspection of the pattern of the absorber layer. For example, use may be made of SiON, a metal-silicon alloy oxynitride (e.g. MoSiON), a chromium oxide (CrO), a chromium oxynitride (CrON), or the like.

On the other hand, when a material containing Cr is used for the lower layer of the absorber layer, pattern formation is normally carried out by dry etching using a mixed gas of chlorine and oxygen. Therefore, the material of the uppermost layer is selected from materials each having a resistance against the chlorine-oxygen mixed gas etching and further each being etchable under the etching condition against which the material containing Cr has a resistance. As such materials, there may be cited, for example, materials containing Si and materials containing Ta. Among those materials, selection is made of a material that exhibits a sufficiently low reflectance with respect to the light having the inspection wavelength for use in the inspection of the pattern of the absorber layer. For example, use may be made of SiON, a metal-silicon alloy oxynitride (e.g. MoSiON), a tantalum oxide (TaO), a tantalum oxynitride (TaON), a tantalum-boron alloy oxide (TaBO), a tantalum-boron alloy oxynitride (TaBNO), a tantalum-silicon oxynitride (TaSiON), or the like.

As described above, for the uppermost layer, use may preferably be made of an oxide, a nitride, or an oxynitride of metal or alloy (e.g. alloy with Si or alloy with B), or the like. The material of the uppermost layer may be selected in relation to the material of the lower layer of the absorber layer so as to satisfy the foregoing etching relationship with the lower layer of the absorber layer. Among them, in case of the metal oxide or the metal nitride, the reflectance with respect to the inspection wavelength generally decreases as the amount of oxygen or nitrogen increases. Therefore, by controlling the amount of oxygen or nitrogen, the reflectance of the uppermost layer with respect to the inspection wavelength can be controlled to some degree. On the other hand, the metal-silicon alloy oxynitride is preferable in that the reflectance is low in a relatively wide wavelength band of the inspection light so that it is possible to flexibly cope with even a change of the inspection light, and that a change in reflectance due to a difference in film thickness is small.

On the other hand, when the buffer layer is disposed between the multilayer reflective film and the absorber layer, the uppermost layer is required to have the following property in addition to the foregoing conditions. Specifically, the uppermost layer is required to have a resistance against the etching condition in forming a pattern in the buffer layer. For example, when a material containing Cr is used for the buffer layer, a gas containing oxygen and chlorine is generally used in etching thereof. Therefore, the uppermost layer of the absorber layer is required to have a resistance against the oxygen-chlorine mixed gas. As such a material, there may be cited, for example, a material containing Si (metal-silicon alloy oxynitride), a material containing Zr, a material containing Ta, a material containing Ti, or the like. Specifically, there may be cited a Ta—Zr alloy (TaZr), a Ta—Zr alloy nitride (TaZrN), a titanium nitride (TiN), an oxide thereof, or the like.

On the other hand, when $SiO_2$ is used for the buffer layer, a fluorine-containing gas such as $SF_6$ or a carbon fluoride ($CF_4$, $C_2F_6$) is used in etching of the buffer layer. Therefore, in this case, a material having a resistance against the fluorine-containing gas is selected for the uppermost layer. As such a material, there may be cited a material containing Cr, a material containing Ti, a material containing Zr, or the like. Specifically, there may be cited a titanium nitride (TiN), a zirconium nitride (ZrN), an oxide thereof, or the like.

It is of course necessary to take into account a relationship with the material of the lower layer of the absorber layer, and therefore, the material of the uppermost layer may be suitably selected depending on the material of the lower layer of the absorber layer in terms of the foregoing etching relationship with the material of the lower layer of the absorber layer.

As described above, the combination of the materials of the respective layers may be determined taking into account the etching conditions and the etching selection ratios in forming the patterns in the uppermost layer, the lower layer of the absorber layer, and the buffer layer, and so as to achieve the sufficient contrast with respect to the pattern inspection wavelength.

The preferable combination of the materials of the respective layers is, for example, the material containing Ta (etchable using chlorine gas) as the lower layer of the absorber layer, the material containing Si (etchable using fluorine-containing gas) as the uppermost layer, and the material containing Cr (etchable using chlorine-oxygen gas) as the buffer layer. It is also preferable to use the material containing Cr (etchable using oxygen-chlorine gas) as the lower layer of the absorber layer, the material containing Si (etchable using fluorine-containing gas) as the uppermost layer, and the material containing Ta (etchable using chlorine gas) as the buffer layer.

On the other hand, if materials can be selected to satisfy the foregoing conditions, not only the dry etching but wet etching may be used in the etching process.

Next, the multilayer reflective film will be described.

As the multilayer reflective film, use is made of a multilayer film in which elements having different refractive indexes are periodically layered. Generally, use is made of a multilayer film in which thin films of a heavy element or its compound and thin films of a light element or its compound are alternately layered by about 40 periods. As a multilayer reflective film with respect to an EUV light having a wavelength of 13 to 14 nm, use is made of a Mo/Si periodic layered film in which Mo and Si are alternately layered by about 40 periods. Besides, as multilayer reflective films for use in the region of the EUV light, there are a Ru/Si periodic multilayer film, a Mo/Be periodic multilayer film, a Mo compound/Si compound periodic multilayer film, a Si/Nb periodic multilayer film, a Si/Mo/Ru periodic multilayer film, a Si/Mo/Ru/Mo periodic multilayer film, a Si/Ru/Mo/Ru periodic multilayer film, and so forth. Selection may be suitably made therefrom according to the exposure wavelength.

The multilayer reflective film can be formed by film formation of the respective layers using the DC magnetron sputtering method, the ion beam deposition method, or the like.

In case of the foregoing Mo/Si periodic multilayer film, according to the DC magnetron sputtering method, a Si film may first be formed in an Ar gas atmosphere by the use of a Si target, then a Mo film may be formed in the Ar gas atmosphere by the use of a Mo target, which are set as one period, then, after layered by 30 to 60 periods, a Si film may finally be formed.

Next, the substrate will be described. As the substrate, a material having a low thermal expansion coefficient (in a range of $0\pm1.0\times10^{-7}/°$ C., and more preferably in a range of $0\pm0.3\times10^{-7}/°$ C.) and excellent in smoothness and flatness and in resistance against a mask cleaning liquid is preferable and use is made of glass having a low thermal expansion property, for example, $SiO_2$—$TiO_2$-based glass or the like. Besides, use may be made of a substrate made of crystallized glass precipitated from a β-quartz solid solution, quartz glass, silicon, metal, or the like. As an example of the metal substrate, an Invar alloy (Fe—Ni-based alloy) or the like may be cited.

It is preferable for the substrate to have a smooth surface with 0.2 nmRms or less and a flatness degree of 100 nm or less for achieving a high reflectance and a high transfer accuracy. Further, the substrate preferably has a high rigidity for preventing deformation thereof caused by a film stress of the film formed thereon. Particularly, it is preferable to have a high Young's modulus of 65 GPa or more.

The unit Rms showing the smoothness in the present invention represents a root mean square roughness that can be measured by an atomic force microscope. The flatness degree described in the present invention is a value representing a warping (deformation amount) of the surface indicated by TIR (Total Indicated Reading) and is an absolute value of a difference in height between the highest position on the surface of the substrate located above a focal plane that is given by a plane determined by the method of least squares using the surface of the substrate as a reference and the lowest position on the surface of the substrate located below the focal plane. In the present invention, the flatness degree is a measured value in an area of 140 mm×140 mm.

Next, description will be given about the manufacturing process of the reflective mask of this embodiment and the inspection of the pattern by taking the case of having the buffer layer as an example.

The reflective mask blank of this embodiment is obtained by forming the multilayer reflective film, the buffer layer, and the respective layers of the absorber layer comprising the two layers, i.e. the lower layer and the uppermost layer, on the substrate in the order named. The materials of the respective layers and the forming methods thereof are as described above. Hereinbelow, description will be given about the case where the buffer layer is made of a material containing chromium, the lower layer of the absorber layer is made of a material containing Ta, and the uppermost layer of the absorber layer is made of a material containing Si.

An absorber pattern is formed in the absorber layer (the uppermost layer and the lower layer) of the reflective mask blank obtained as described above. First, an EB (for electron beam irradiation) resist is applied onto the uppermost layer of the absorber layer and baking is carried out. Then, drawing is carried out using an EB drawing machine and subjected to development, thereby forming a pattern in the resist. As a resist, a chemically amplified resist may be used instead of the EB resist.

Next, following the resist pattern, etching is performed in the uppermost layer of the absorber layer using a fluorine-containing gas, thereby forming an etching mask pattern in the uppermost layer. Thereafter, the resist on the uppermost layer is removed using a hot concentrated sulfuric acid.

Further, using the etching mask pattern formed in the uppermost layer as a mask, dry etching is performed in the lower layer of the absorber layer by the use of chlorine, thereby forming the absorber pattern. In the present invention, since the patterning of the lower layer of the absorber layer is carried out using the thin uppermost layer of the absorber layer as the etching mask, the patterning can be achieved with high shape accuracy even in case of the pattern with a narrow line width.

Here, first, an inspection is performed to determine whether or not the absorber pattern is formed in accordance with a design.

In the inspection of the absorber pattern, a far ultraviolet light having a wavelength of about 190 nm to 260 nm is used as an inspection light as described before and this inspection light is incident upon the mask formed with the absorber pattern. Herein, the inspection is implemented by detecting the inspection light reflected on the absorber pattern and the inspection light reflected on the buffer layer exposed by the removal of the absorber layer and observing a contrast therebetween. In the present invention, since the uppermost layer of the absorber layer is made of the material with a low reflection with respect to the inspection wavelength, the sufficient contrast can be achieved.

In this manner, detection is made of a pinhole defect (white defect) formed by removal of the absorber layer that should not be removed and the absorber layer (black defect) remaining without being removed due to insufficient etching.

When the pinhole defect or the defect caused by the insufficient etching is detected, correction thereof is carried out. The correction of the pinhole defect can be carried out by a method of depositing a carbon film according to the focused ion beam (FIB) assist deposition method, or the like. On the other hand, the correction of the defect caused by the insufficient etching can be carried out by removing the unnecessary portion by FIB irradiation or the like.

Next, using the pattern of the uppermost layer of the absorber layer as a mask, the buffer layer is removed according to the absorber pattern to thereby form a pattern in the buffer layer. In case of the buffer layer using a material containing chromium, use is made of dry etching using a gas containing chlorine and oxygen.

Finally, a final confirmation inspection of the formed pattern is implemented. This final confirmation inspection finally confirms whether or not the pattern is formed with dimensional accuracy according to a specification.

Also in case of this final inspection, a far ultraviolet light having a wavelength of about 190 nm to 260 nm is used and this inspection light is incident upon the mask where the absorber layer and the buffer layer are formed in a pattern. In this case, the inspection is implemented by detecting the inspection light reflected on the absorber pattern and the inspection light reflected on the multilayer reflective film exposed by the removal of the absorber layer and the buffer layer and observing a contrast therebetween.

In the present invention, since the material with a low reflection with respect to the light having the inspection wavelength is used for the uppermost layer of the absorber layer, the sufficient contrast can be achieved also in the final inspection.

It is preferable that the reflectances of the respective layers with respect to the light having the inspection wavelength be designed to decrease in order of the surface of the multilayer reflective film, the surface of the buffer layer, and the surface of the absorber layer. With this arrangement, the portion where the absorber layer pattern exists becomes dark in either of the pattern inspections so that inversion of the pattern contrast does not occur, and therefore, it is not necessary to change setting of an inspection device and the results are easy to understand.

Note that it is possible not to carry out the removal of the buffer layer in the foregoing mask manufacturing process when the buffer layer is formed thin so that an influence to reflectance reduction is small. In this case, the reflective mask is used in the state where the multilayer reflective film is entirely covered with the buffer layer. Further, the buffer layer may be formed depending on necessity and it is possible not to form the buffer layer.

As described above, in the present invention, the absorber layer is formed into the layered structure and the uppermost layer thereof serves as the low reflection layer in the inspection of the mask pattern and also serves as the etching mask layer when patterning the lower layer of the absorber layer. Therefore, there are obtained the reflective mask blank and the reflective mask that can, with the simple layer structure, achieve the sufficient contrast in the inspection of the mask pattern, form the pattern with high shape accuracy even if the line width thereof is thin, and obtain a high-quality transfer image.

It is preferable that the foregoing EUV light (wavelength: about 0.2 to 100 nm) be used as an exposure light for any of the foregoing reflective masks and reflective mask blanks, but they can be suitably used with respect to lights having other wavelengths.

Hereinbelow, the present invention will be described more specifically by the use of an example.

Figure 1:
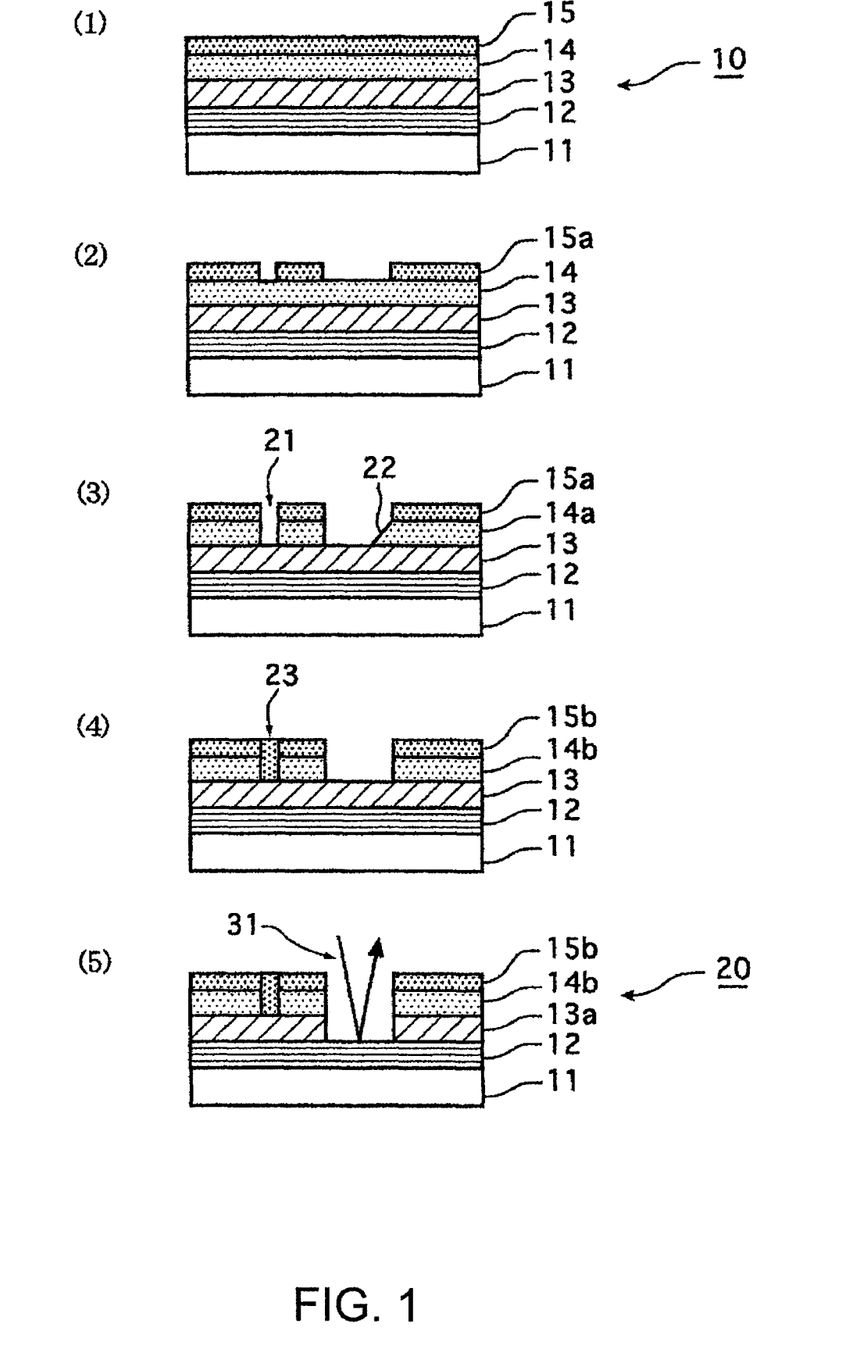
FIG. 1 is a sectional structural view showing a manufacturing process of a reflective mask according to an embodiment of the present invention.

FIG. 1 is a diagram showing a manufacturing process of a reflective mask according to an embodiment of the present invention. A reflective mask blank 10 of this embodiment is shown in FIG. 1 at (1). A substrate 11 is a quartz glass substrate (external shape: 6 inch square, thickness: 0.25 inches). The glass substrate was formed to have a smooth surface with 0.2 nmRms or less and a flatness degree of 100 nm or less by mechanical abrasion.

In this embodiment, as a multilayer reflective film 12 formed on the substrate 11, a Mo/Si periodic multilayer reflective film was adopted for forming a multilayer reflective film suitable for an exposure light wavelength band of 13 to 14 nm. The multilayer reflective film 12 was formed by alternately layering Mo and Si on the substrate by the use of ion beam film deposition (IBD). After layering 40 periods with a Si film of 4.2 nm and a Mo film of 2.8 nm given as one period, a Si film was finally formed to a thickness of 7 nm. The total film thickness was 287 nm. With respect to this multilayer reflective film, the reflectance of a light of 13.4 nm at an incident angle of 2 degrees was 62.4%. Further, the reflectance with respect to a light having a wavelength of 257 nm was 60%.

A buffer layer 13 formed on the multilayer reflective film 12 was made of chromium nitride and had a film thickness of 50 nm. This chromium nitride was Cr:N=90:10 (at %). The buffer layer 13 was formed by the DC magnetron reactive sputtering method using a Cr target and using, as a sputtering gas, a gas containing Ar and 10% of nitrogen added thereto. It was confirmed by the X-ray diffraction method that the crystal state of the formed buffer layer 13 was microcrystal. The reflectance on the surface of the buffer layer 13 with respect to the light of 257 nm was 42.1%.

A lower layer 14 of an absorber layer of this embodiment formed on the buffer layer 13 was made of a tantalum-boron alloy nitride (TaBN) that was formed to a film thickness of 50 nm. The material of the lower layer of the absorber layer had a composition in which Ta:B:N was 65.6:16.4:18 (at %). The lower layer 14 of the absorber layer was formed by the DC magnetron reactive sputtering method using a sintered target containing Ta and B and using a gas containing Ar and nitrogen added thereto. The crystal state of the formed lower layer 14 of the absorber layer was amorphous. Further, the absorption coefficient with respect to the EUV light with the wavelength of 13.4 nm was 0.03 and the reflectance with respect to the light with the wavelength of 257 nm was 34.2%.

On the lower layer 14 of the absorber layer, an uppermost layer 15 of the absorber layer was formed to a thickness of 22 nm. For this uppermost layer, a molybdenum-silicon alloy oxynitride (MoSiON) was selected in view of the etching condition and the etching selection ratio with respect to the lower layer 14 of the absorber layer and the buffer layer 13 and in view of obtaining a low reflectance with respect to the inspection light having the wavelength of 257 nm. The composition ratio thereof was Mo:Si:O:N=19:19:43:19 (at %). The uppermost layer 15 was formed by the DC magnetron reactive sputtering method using a MoSi target and using a gas containing Ar with oxygen and nitrogen added thereto. The absorption coefficient of the obtained film with respect to the EUV light having the wavelength of 13.4 nm was 0.4. Further, the reflectance on the surface of the uppermost layer with respect to the inspection light having the wavelength of 257 nm was 4.4% and the reflectance with respect to the light having the wavelength of 13.4 nm was 0.6%.

Figure 2:
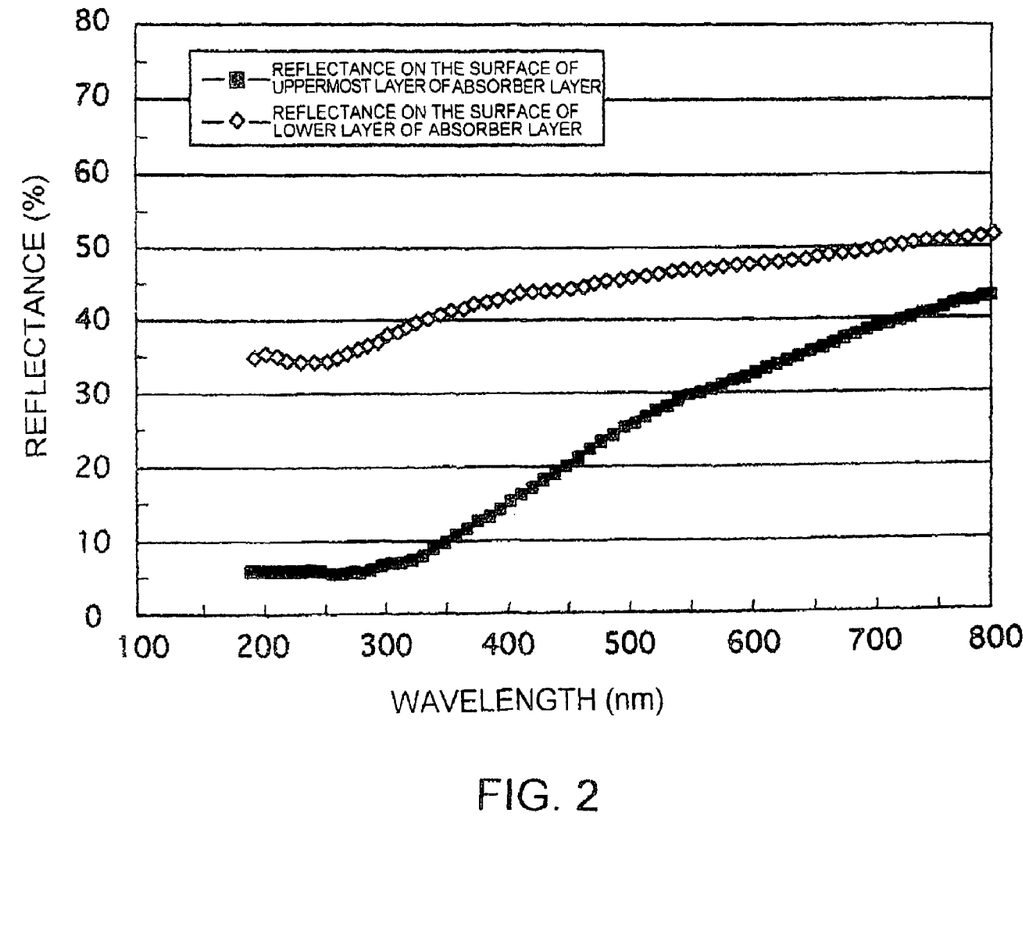
FIG. 2 is a graph showing a reflectance on the surface of an uppermost layer of an absorber layer and a reflectance on the surface of a lower layer before forming the uppermost layer, with respect to a light having a wavelength in the range of 190 nm to 800 nm.

FIG. 2 is a graph showing a reflectance on the surface of the uppermost layer of the absorber layer and a reflectance on the surface of the lower layer before forming the uppermost layer, with respect to a light having a wavelength in the range of 190 nm to 800 nm. As shown in the figure, the reflectance with respect to the inspection wavelength was largely reduced by the use of the MoSiON material for the uppermost layer.

In the manner as described above, the reflective mask blank 10 of this embodiment shown in FIG. 1 at (1) was obtained.

Next, description will be given about a method of producing a reflective mask 20 shown in FIG. 1 at (5) from the foregoing reflective mask blank 10.

First, an organic photoresist was applied in a film thickness of 200 nm onto the uppermost layer 15 of the absorber layer of the foregoing reflective mask blank 10, and was subjected to drawing by the use of an EB drawing machine and then development, thereby forming a resist pattern (not shown).

Using this resist pattern as a mask, dry etching was applied to the uppermost layer 15 of the absorber layer by the use of a SF$_6$ gas to thereby form a mask pattern 15a in the uppermost layer 15 of the absorber layer. The etching selection ratio between the uppermost layer of the absorber layer and the lower layer of the absorber layer was about 10 with respect to the etching condition of the uppermost layer of the absorber layer using the SF$_6$ gas so that the lower layer had a sufficient etching resistance against the etching condition of the uppermost layer.

Further, the resist pattern remaining on the uppermost layer was treated by a sulfuric acid aqueous solution so as to be removed by dissolution (FIG. 1 at (2)).

Next, using the mask pattern 15a formed in the uppermost layer as a mask, an absorber pattern 14a was formed in the lower layer 14 of the absorber layer (FIG. 1 at (3)). The formation of this pattern was implemented by etching using a chlorine gas. The etching selection ratio between the lower layer and the uppermost layer was about 25 under the etching condition of the lower layer of the absorber layer. The uppermost layer was slightly reduced in film thickness, but had a sufficient resistance against the etching condition of the lower layer.

First, an inspection of the absorber pattern was performed in this state. This inspection of the absorber pattern was carried out by using an inspection light having a wavelength of 257 nm, causing the inspection light to be incident upon the surface of the mask, and observing a contrast between the inspection light reflected by the absorber pattern 15a of the uppermost layer and the inspection light reflected by the surface of the buffer layer 13 exposed by the removal of the absorber layer.

The ratio in reflectance with respect to the inspection light between the surface of the absorber pattern 15a and the surface of the buffer layer 13 was 1:9.6 and the contrast value was 81% in this embodiment, so that the sufficient contrast was achieved in the pattern inspection.

Based on this inspection result, a pinhole defect 21 (white defect) and an etching insufficient defect 22 (black defect) generated in the lower layer of the absorber layer as shown in FIG. 1 at (3) were corrected. The white defect was corrected by depositing a carbon film 23 according to the focused ion beam (FIB) assist deposition method, while the black defect was corrected by removing the residual portion by laser beam irradiation, thereby obtaining patterns 15b and 14b of the absorber layer (FIG. 1 at (4)).

Next, the chromium nitride layer serving as the buffer layer 13 remaining in the reflection region (the portion where the patterns 15b and 14b of the absorber layer were not provided) of the mask was removed in accordance with the patterns of the absorber layer to thereby form a pattern 13a of the buffer layer (FIG. 1 at (5)). Dry etching by a mixed gas of chlorine and oxygen was used for the removal of the buffer layer 13. The etching selection ratio between the buffer layer and the uppermost layer was about 25 with respect to the etching condition of the buffer layer 13. The uppermost layer was slightly reduced in film thickness, but had a sufficient resistance against the etching condition of the buffer layer 13. The final film thickness of the uppermost layer was 20 nm.

In the manner as described above, there was obtained the reflective mask 20 having the structure shown in FIG. 1 at (5).

Here, a final inspection of the reflective mask 20 was carried out. The final inspection was implemented by, like in the foregoing inspection, using a light having a wavelength of 257 nm as an inspection light, causing the inspection light to be incident onto the surface of the mask, and observing a contrast between the inspection light reflected by the absorber pattern 15b of the uppermost layer and the inspection light reflected by the multilayer reflective film 12. The ratio in reflectance with respect to the inspection light between the surface of the absorber pattern 15b and the surface of the multilayer reflective film 12 exposed by the removal of the buffer layer 13 was 1:13.6 and the contrast value was 86%, so that the sufficient contrast was achieved also in the final inspection.

As described above, it was confirmed by the inspection that the pattern for 16 Bbit-DRAM of a 0.07 μm design rule was formed in the reflective mask 20 in accordance with the design.

Figure 3:
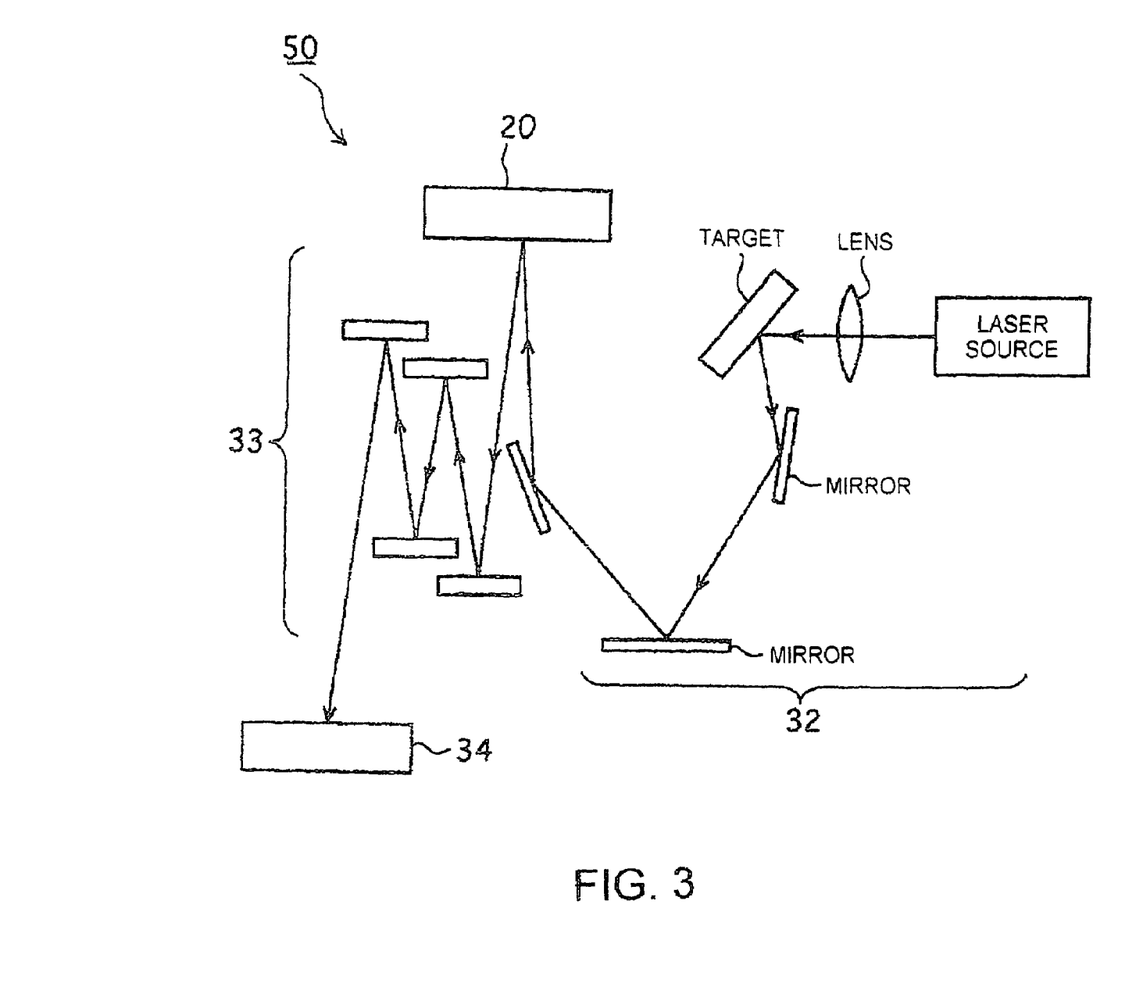
FIG. 3 is a schematic structural diagram of a pattern transfer apparatus.

Next, referring to FIG. 3, description will be given about a method of transferring the pattern onto a semiconductor substrate with a resist using the EUV light by the use of the reflective mask 20 of this embodiment. FIG. 3 is a schematic structural diagram of a pattern transfer apparatus that uses a reflective mask. As shown in the figure, a pattern transfer apparatus 50 is roughly composed of a laser-plasma X-ray source 32, the reflective mask 20, a reducing optical system 33, and so forth. The reducing optical system 33 uses X-ray reflection mirrors and the pattern reflected from the reflection mask 20 is normally reduced to about ¼ through the reducing optical system 33. Since the wavelength band of 13 to 14 nm is used for the exposure wavelength, it has been set in advance that an optical path is in a vacuum.

In this state, an EUV light obtained from the laser-plasma X-ray source 32 was caused to be incident upon the reflective mask 20 and the light reflected therefrom was transferred onto a Si wafer 34 through the reducing optical system 33. The light incident upon the reflective mask 20 is absorbed by the absorber layer and is not reflected at the portion where the absorber pattern exists, while the light incident upon the portion where the absorber pattern does not exist is reflected by the multilayer reflective film. In this manner, an image formed by the light reflected from the reflective mask 20 enters the reducing optical system 33. The exposure light having passed through the reducing optical system 33 exposes the transfer pattern onto a resist layer on the Si wafer 34. Then, by developing the exposed resist, a resist pattern was formed.

As a result of carrying out the pattern transfer onto the semiconductor substrate as described above, it has been confirmed that the accuracy of the reflective mask of this embodiment is 16 nm or less which is a required accuracy of the 70 nm design rule.

On the other hand, as a comparative example, a reflective mask blank was obtained such that an absorber layer had a single-layer structure, made of a tantalum-boron alloy nitride like the lower layer of the absorber layer of the foregoing embodiment, and had a film thickness of 70 nm being substantially equal to the total film thickness of the uppermost layer and the lower layer of the absorber layer of the foregoing embodiment, and the other structure was the same as the foregoing embodiment. This comparative example differs from the foregoing embodiment in that the absorber layer had the single-layer structure as described above, and further, an organic resist was used as a mask when etching the absorber layer.

A resist for electron beam irradiation made of an organic substance was applied in a thickness of 400 nm onto the absorber layer of the mask blank of this comparative example. This resist was subjected to baking, then subjected to electron beam irradiation and development, thereby forming a resist pattern. Using this resist pattern as a mask, a pattern was formed in the absorber layer. A chlorine gas was used for the pattern formation of the absorber layer. The etching selection ratio between the resist for electron beam irradiation made of the organic substance and the absorber layer was about 1. After the pattern formation of the absorber layer, the organic resist was reduced in thickness by about 100 nm, which was also caused by occurrence of overetching. After the pattern formation of the absorber layer, the resist was removed using a hot concentrated sulfuric acid.

After forming the pattern in the absorber layer as described above, an inspection of the absorber pattern was performed using an inspection light having a wavelength of 257 nm like in the foregoing embodiment. The reflectance on the surface of the absorber layer with respect to the inspection light was 34.2%. The ratio in reflectance with respect to the inspection light between the surface of the absorber layer and the surface of the buffer layer was 1:1.2 and the contrast value was small like 10%, so that it was not possible to carry out the accurate inspection. Further, in observation of the formed absorber pattern by the use of a SEM (Scanning Electron Microscope), many etching insufficient defects (black defects) were observed particularly at those portions where the line width was narrow. Further, there were observed portions where the shapes according to the design were not achieved.

The invention claimed is:

1. A manufacturing method of a reflective mask comprising a substrate, and a multilayer reflective film for reflecting an exposure light and an absorber layer formed in a pattern and absorbing the exposure light, which are formed on said substrate in the order named, wherein said absorber layer has a layered structure comprising at least an uppermost layer and a lower layer other than it, said method comprising the steps of:

forming a pattern in said uppermost layer, and etching said lower layer of the absorber layer using the pattern formed in said uppermost layer as a mask to thereby form a pattern in said lower layer, wherein an etching selection ratio between said uppermost layer and said lower layer is 5 or more.

2. The method according to claim 1, wherein said lower layer of the absorber layer is made of a material containing tantalum (Ta) and said uppermost layer is made of a material containing silicon (Si).

3. The method according to claim 1, wherein said lower layer of the absorber layer is made of a material containing chromium (Cr) and said uppermost layer is made of a material containing tantalum (Ta).

4. The method according to claim 1, wherein said lower layer of the absorber layer is made of a material containing chromium (Cr) and said uppermost layer is made of a material containing silicon (Si).

5. The method according to claim 1, wherein said uppermost layer is formed to a thickness of 15 to 30 nm.

6. The method according to claim 1, wherein said absorber layer has a film thickness of 30 to 100 nm.

7. The method according to claim 1, wherein said uppermost layer has an EUV absorption coefficient of 0.01 or more.

8. The method according to claim 1, wherein the lower layer of said absorber layer has an absorption coefficient with respect to a wavelength of an exposure light that is 0.025 or more.

9. The method according to claim 1, wherein a buffer layer having a resistance against an etching condition in forming the pattern in said lower layer of the absorber layer and correcting the pattern is further provided between said multilayer reflective film and said absorber layer and, said method comprising the step, after forming the patterns in said uppermost layer and said lower layer of the absorber layer, of etching said buffer layer using a pattern formed in said absorber layer as a mask to thereby form a pattern in said buffer layer.

10. The method according to claim 1, wherein said uppermost layer exhibits a reflectance of 20% or less with respect to a light having an inspection wavelength for use in an inspection of an absorber layer pattern formed in said absorber layer.

11. The method according to claim 1, wherein said uppermost layer exhibits a constant value of 40% or more relative to a layer just upper said absorber layer with respect to a light having an inspection wavelength for use in an inspection of an absorber layer pattern formed in said absorber layer, said constant value given by an equation of:

$$\text{Constant Value}(\%) = (R_2 - R_1)/(R_2 + R_1) \times 100$$

(where R1 represents a reflectance on the surface of the uppermost layer with respect to the light having the inspection wavelength and $R_2$ represents a reflectance on the surface of the layer just under the absorber layer).

12. The method according to claim 1, wherein further comprises the steps of performing an inspection of an absorber pattern after forming said lower pattern and of correcting an absorber layer pattern based on an inspection result.

* * * * *